United States Patent
Okada et al.

(10) Patent No.: US 10,100,432 B2
(45) Date of Patent: *Oct. 16, 2018

(54) APPARATUS FOR PRODUCING SIC SINGLE CRYSTAL AND METHOD FOR PRODUCING SIC SINGLE CRYSTAL

(71) Applicant: TOYOTA JIDOSHA KABUSHIKI KAISHA, Aichi (JP)

(72) Inventors: Nobuhiro Okada, Kisarazu (JP); Kazuhito Kamei, Kimitsu (JP); Kazuhiko Kusunoki, Nishinomiya (JP); Nobuyoshi Yashiro, Itami (JP); Koji Moriguchi, Nishinomiya (JP); Hironori Daikoku, Susono (JP); Motohisa Kado, Susono (JP); Hidemitsu Sakamoto, Susono (JP)

(73) Assignee: TOYOTA JIDOSHA KABUSHIKI KAISHA, Aichi (JP)

( * ) Notice: Subject to any disclaimer, the term of this patent is extended or adjusted under 35 U.S.C. 154(b) by 365 days.

This patent is subject to a terminal disclaimer.

(21) Appl. No.: 14/411,942

(22) PCT Filed: Jul. 10, 2013

(86) PCT No.: PCT/JP2013/004259
§ 371 (c)(1),
(2) Date: Dec. 30, 2014

(87) PCT Pub. No.: WO2014/013698
PCT Pub. Date: Jan. 23, 2014

(65) Prior Publication Data
US 2015/0152569 A1    Jun. 4, 2015

(30) Foreign Application Priority Data
Jul. 19, 2012  (JP) .................................. 2012-160188

(51) Int. Cl.
*C30B 15/32*  (2006.01)
*C30B 29/36*  (2006.01)
(Continued)

(52) U.S. Cl.
CPC ................ *C30B 15/32* (2013.01); *C30B 9/06* (2013.01); *C30B 15/30* (2013.01); *C30B 19/068* (2013.01);
(Continued)

(58) Field of Classification Search
CPC combination set(s) only.
See application file for complete search history.

(56) References Cited

U.S. PATENT DOCUMENTS 4,157,373 A * 6/1979 Berkman ................ C30B 15/08
117/211
5,833,750 A * 11/1998 Mizuishi ................ C30B 15/32
117/200
(Continued)

FOREIGN PATENT DOCUMENTS

| | | |
|---|---|---|
| CN | 102264955 | 11/2011 |
| JP | 2010-248003 | 11/2002 |

(Continued)

*Primary Examiner* — Erin F Bergner
(74) *Attorney, Agent, or Firm* — Clark & Brody

(57) ABSTRACT

An apparatus (10) for producing an SiC single crystal is used in the solution growth includes a seed shaft (28) and a crucible (14). The seed shaft (28) has a lower end surface (28S) to which an SiC seed crystal (32) is to be attached. The crucible (14) holds an Si—C solution (15). The seed shaft (28) includes a cylinder part (28A), a bottom part (28B), and a low heat conductive member (28C). The bottom part (28B) is located at the lower end of the cylinder part (28A) and has the lower end surface (28S). The low heat conductive member (28C) is arranged on the upper surface of the bottom part (28B) and has a thermal conductivity lower than that of the bottom part (28B). This production apparatus can
(Continued)

make the temperature within the crystal growth surface of the SiC seed crystal less liable to vary.

13 Claims, 10 Drawing Sheets

(51) Int. Cl.
  *C30B 9/06* (2006.01)
  *C30B 15/30* (2006.01)
  *C30B 19/06* (2006.01)
(52) U.S. Cl.
  CPC ......... *C30B 29/36* (2013.01); *Y10T 117/1024* (2015.01); *Y10T 117/1032* (2015.01)

(56) References Cited

U.S. PATENT DOCUMENTS

| | | | | |
|---|---|---|---|---|
| 6,106,611 | A * | 8/2000 | Aydelott | C30B 15/32 117/13 |
| 9,523,156 | B2 * | 12/2016 | Kado | C30B 29/36 |
| 2007/0209573 | A1 | 9/2007 | Kusunoki et al. | |
| 2011/0200833 | A1 * | 8/2011 | Kamei | C30B 9/10 428/446 |
| 2011/0315073 | A1 | 12/2011 | Sakamoto et al. | |
| 2012/0160153 | A1 | 6/2012 | Ishii et al. | |
| 2012/0211769 | A1 | 8/2012 | Kusunoki et al. | |
| 2014/0007807 | A1 | 1/2014 | Daikoku et al. | |
| 2014/0299046 | A1 | 10/2014 | Domoto et al. | |

FOREIGN PATENT DOCUMENTS

| | | |
|---|---|---|
| JP | 2005-089223 | 4/2005 |
| JP | 2006-117441 | 5/2006 |
| JP | 2007-186356 | 7/2007 |
| JP | 2007-186374 | 7/2007 |
| JP | 2008-105896 | 5/2008 |
| JP | 2010-184838 | 8/2010 |
| JP | 2010-208926 | 9/2010 |
| JP | 2013-147397 | 8/2013 |
| JP | 2011-251881 | 12/2015 |
| WO | 2010/103387 | 9/2010 |
| WO | 2011/024931 | 3/2011 |
| WO | 2012/127703 | 9/2012 |
| WO | 2012/173251 | 12/2012 |
| WO | 2013/062130 | 5/2013 |

* cited by examiner

APPARATUS FOR PRODUCING SIC SINGLE CRYSTAL AND METHOD FOR PRODUCING SIC SINGLE CRYSTAL

TECHNICAL FIELD

The present invention relates to an apparatus for producing an SiC single crystal and a method for producing an SiC single crystal and, more particularly, to an apparatus for producing an SiC single crystal used in the solution growth method and a method for producing an SiC single crystal using the production apparatus.

BACKGROUND ART

As a method for producing a single crystal of silicon carbide (SiC), the solution growth method is known. In the solution growth method, an SiC seed crystal is disposed at the lower end of a seed shaft, and the lower surface (hereinafter, referred to as a "crystal growth surface") of SiC seed crystal is brought into contact with an Si—C solution. Thereby, an SiC single crystal is grown on the crystal growth surface of SiC seed crystal that has been brought into contact with the Si—C solution. The Si—C solution is a solution in which carbon (C) is dissolved in the melt of Si or an Si alloy.

It is preferable that the surface (hereinafter, referred to as a "growth surface") of SiC single crystal that grows on the crystal growth surface of SiC seed crystal is flat. If a difference in temperature lies within the crystal growth surface of SiC seed crystal, a region in which the SiC single crystal is liable to grow and a region in which the SiC single crystal is less liable to grow are formed within the crystal growth surface of SiC seed crystal. For this reason, unevenness is produced on the growth surface of SiC single crystal. Therefore, in order to make the growth surface of SiC single crystal flat, it is necessary to have a uniform temperature distribution within the crystal growth surface of SiC seed crystal.

Also, in recent years, it has been required to produce a larger SiC single crystal. In order to increase the size of SiC single crystal, it is necessary to make the crystal growth surface of SiC seed crystal larger. If the crystal growth surface of SiC seed crystal is made large, the difference in temperature within the crystal growth surface of SiC seed crystal becomes liable to occur. Therefore, to produce a larger SiC single crystal as well, it is necessary to have a uniform temperature distribution within the crystal growth surface of SiC seed crystal as far as possible.

Japanese Patent Application Publication No. 2008-105896 discloses a method for producing an SiC single crystal. In the method for producing an SiC single crystal described in this publication, an SiC seed crystal that is larger than the lower end surface of the seed shaft is attached to the lower end surface of the seed shaft, and the whole of the SiC seed crystal is immersed in the Si—C solution. Therefore, the difference in temperature within the crystal growth surface of SiC seed crystal is less liable to occur as compared with the case where the crystal growth surface of SiC seed crystal is brought into contact with the liquid surface of Si—C solution.

Explaining more detailedly, in the case where the crystal growth surface of SiC seed crystal is brought into contact with the liquid surface of Si—C solution, the upper surface of SiC seed crystal comes into contact with an inert gas that fills the space in a crucible holding the Si—C solution excluding a region that is in contact with the lower end surface of the seed shaft. In this case, on the upper surface of SiC seed crystal, the heat transfer condition differs from the region that is in contact with the lower end surface of the seed shaft to other regions. In particular, in the region that comes into contact with the inert gas, the heat transfer condition changes easily, for example, due to the flow of inert gas. As the result, the temperature distribution on the upper surface of SiC seed crystal is liable to be nonuniform. If the temperature distribution on the upper surface of SiC seed crystal is uniform, usually, on the crystal growth surface of SiC seed crystal, uniform temperature distribution is ensured by the contact with the Si—C solution whose temperature is controlled. On the other hand, if the temperature distribution on the upper surface of SiC seed crystal is nonuniform, the temperature distribution on the crystal growth surface of SiC seed crystal is affected. Therefore, the temperature on the crystal growth surface of SiC seed crystal undesirably becomes nonuniform.

If the whole of the SiC seed crystal is immersed in the Si—C solution as described in the above-described publication, even on the upper surface of SiC seed crystal, uniform temperature distribution is ensured by the contact with the Si—C solution whose temperature is controlled. Therefore, the difference in temperature within the crystal growth surface of SiC seed crystal becomes less liable to occur.

CITATION LIST

Patent Literature

Patent Literature 1: Japanese Patent Application Publication No. 2008-105896

SUMMARY OF INVENTION

Technical Problem

However, even if the SiC seed crystal that is larger than the lower end surface of the seed shaft is attached to the lower end surface of the seed shaft, and the whole of the SiC seed crystal is immersed in the Si—C solution, a difference in temperature occurs sometimes within the crystal growth surface of SiC seed crystal.

An objective of the present invention is to provide an apparatus for producing an SiC single crystal, a method for producing an SiC single crystal, and a seed shaft, which are capable of suppressing a difference in temperature within the crystal growth surface of an SiC seed crystal.

Solution to Problem

The apparatus for producing an SiC single crystal in accordance with an embodiment of the present invention is used in a solution growth method. The apparatus for producing an SiC single crystal includes a seed shaft and a crucible. The seed shaft has a lower end surface to which an SiC seed crystal is to be attached. The crucible holds an Si—C solution. The seed shaft includes a cylinder part, a bottom part, and a low heat conductive member. The bottom part is located at a lower end of the cylinder part, and has the lower end surface. The low heat conductive member is arranged on an upper surface of the bottom part, and has a thermal conductivity lower than that of the bottom part.

The method for producing an SiC single crystal in accordance with the embodiment of the present invention uses the above-described production apparatus. The production method includes a step of attaching an SiC seed crystal to the lower end surface of the seed shaft, a step of heating the crucible holding a raw material to produce the Si—C solution, a step of bringing the SiC seed crystal attached to the lower end surface of the seed shaft into contact with the Si—C solution, and a step of forming and growing an SiC single crystal on the SiC seed crystal.

The seed shaft in accordance with the embodiment of the present invention is used for production of an SiC single crystal by a solution growth method. The seed shaft has a lower end surface to which an SiC seed crystal is attached. This seed shaft includes a cylinder part, a bottom part that is located at the lower end of the cylinder part and has the lower end surface, and a low heat conductive member that is arranged on an upper surface of the bottom part and has a thermal conductivity lower than that of the bottom part.

Advantageous Effects of Invention

By the apparatus for producing an SiC single crystal and the method for producing an SiC single crystal in accordance with the embodiment of the present invention, the difference in temperature within the crystal growth surface of SiC seed crystal can be suppressed.

DESCRIPTION OF EMBODIMENTS

Figure 1:
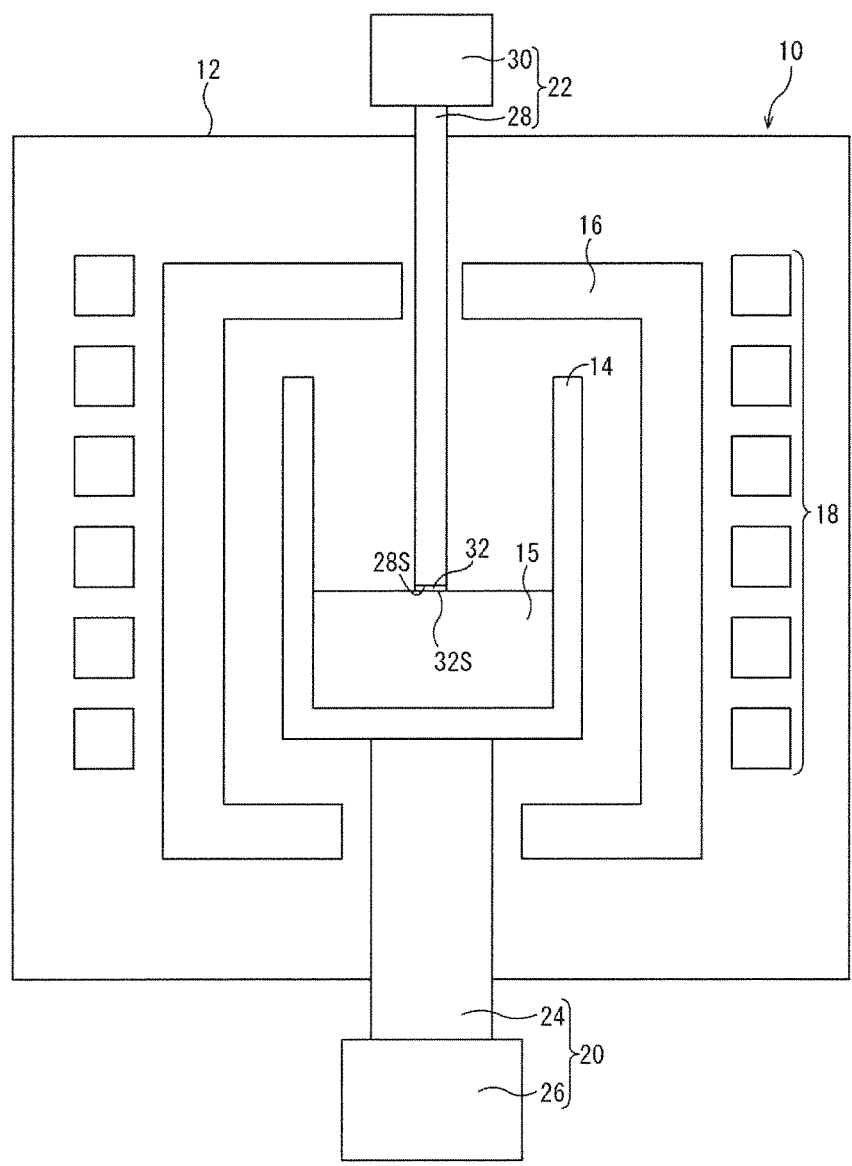
FIG. 1 is a schematic view of an apparatus for producing an SiC single crystal in accordance with an embodiment of the present invention.

The apparatus for producing an SiC single crystal in accordance with an embodiment of the present invention is used in the solution growth method. The apparatus for producing an SiC single crystal includes a seed shaft and a crucible. The seed shaft has a lower end surface to which an SiC seed crystal is to be attached. The crucible holds an Si—C solution. The seed shaft is of a hollow-shell structure, and includes a cylinder part, a bottom part, and a low heat conductive member. The bottom part is located at a lower end of the cylinder part, and has the lower end surface. The low heat conductive member is arranged on an upper surface of the bottom part, and has a thermal conductivity lower than that of the bottom part. Incidentally, the "thermal conductivity" is the thermal conductivity at the temperature of the bottom part and the low heat conductive member at the time when an SiC single crystal is produced, for example, being the thermal conductivity at a temperature of 1000 to 2000° C.

For the seed shaft, the bottom part is cooled by radiation heat dissipation. In the space in the seed shaft, the temperature is higher in a region closer to the cylinder part. That is, in the space in the seed shaft, a difference in temperature lies in the direction perpendicular to the center axis. Therefore, a difference is also produced in the heat dissipation amount in the bottom part. As the result, a difference in temperature is liable to occur in the bottom part. Therefore, a difference of elevation is liable to occur in the temperature distribution within the crystal growth surface of SiC seed crystal attached to the bottom part.

In the above-described production apparatus, the low heat conductive member is arranged on the upper surface of the bottom part. For this reason, the heat dissipation from the bottom part is suppressed by the low heat conductive member. As the result, the difference in temperature becomes less liable to occur in the bottom part. Therefore, the difference in temperature within the crystal growth surface of SiC seed crystal attached to the bottom part becomes less liable to occur.

The low heat conductive member is not restricted especially if it has a thermal conductivity lower than that of the bottom part. For example, this member is a heat insulator.

The low heat conductive member need not cover the whole of upper surface of the bottom part. For example, if it is desired to suppress the heat dissipation from the central portion of the bottom part, the low heat conductive member is arranged in the central portion of the bottom part.

The thickness of the low heat conductive member need not be constant. For example, if it is desired to suppress the heat dissipation from the central portion of the bottom part as compared with the heat dissipation from a peripheral edge portion of the bottom part, the thickness of the low heat conductive member may be thicker in the central portion than in the peripheral edge portion thereof.

In this case, the low heat conductive member may include a first low heat conductive part arranged on the upper surface of the bottom part and a second low heat conductive part arranged on the central portion of an upper surface of the first low heat conductive part.

The low heat conductive member may include a first covering part that covers the upper surface of the bottom part, and a second covering part that is connected to the upper surface of the first covering part and covers an inner peripheral surface of the cylinder part. In this case, a rise in temperature in the seed shaft caused with the cylinder part serving as a heat source is suppressed.

The low heat conductive member need not be in contact with the upper surface of the bottom part. For example, a high heat conductive member having a thermal conductivity higher than that of the bottom part may be arranged between the low heat conductive member and the bottom part. Here, the thermal conductivity of the high heat conductive member is defined like the thermal conductivities of the bottom part and the low heat conductive member. That is, the thermal conductivity of the high heat conductive member is the thermal conductivity at the temperature of the high heat conductive member at the time when an SiC single crystal is produced, for example, being the thermal conductivity at a temperature of 1000 to 2000° C.

In this case, in a region, with which the high heat conductive member is in contact, of the bottom part, a difference in temperature is less liable to occur. In addition, heat dissipation from the high heat conductive member and the bottom part is suppressed by the low heat conductive member. Therefore, a difference in temperature is less liable to occur in the bottom part.

The high heat conductive member is not restricted especially if it has a thermal conductivity higher than that of the bottom part. For example, this member is a metal.

The thermal conductivity of the low heat conductive member may have an anisotropy. For example, the thermal conductivity in an axial direction of the seed shaft of the low heat conductive member may be lower than the thermal conductivity in a direction perpendicular to the axial direction of the seed shaft of the low heat conductive member.

In this case, in a region, with which the low heat conductive member is in contact, of the bottom part, a difference in temperature is less liable to occur. Therefore, a difference in temperature is less liable to occur in the bottom part.

The low heat conductive member having an anisotropic thermal conductivity as described above is, for example, pyrolytic graphite.

The production apparatus may further include a heat absorbing source arranged above the low heat conductive member in the cylinder part, and an elevating device for moving the heat absorbing source up and down. In this case, a distance of the heat absorbing source from the bottom part can be regulated by the elevating device. Therefore, the heat dissipation amount in the bottom part can be controlled.

The method for producing an SiC single crystal in accordance with the embodiment of the present invention uses the above-described production apparatus.

Hereunder, the apparatus for producing an SiC single crystal in accordance with the embodiment is explained more specifically with reference to the accompanying drawings. In the drawings, the same reference signs are applied to the same or equivalent elements, and the explanation of these elements is not repeated.

[Production Apparatus]

FIG. 1 is a schematic configuration drawing of an apparatus 10 for producing an SiC single crystal in accordance with the embodiment of the present invention. As shown in FIG. 1, the apparatus 10 includes a chamber 12, a crucible 14, a heat insulating member 16, a heating device 18, a rotating device 20, and an elevating device 22.

The chamber 12 holds the crucible 14. When an SiC single crystal is produced, the chamber 12 is cooled.

The crucible 14 holds an Si—C solution 15. The Si—C solution 15 is a raw material for the SiC single crystal. The Si—C solution 15 contains silicon (Si) and carbon (C).

The raw material for the Si—C solution 15 is, for example, an Si simple substance or a mixture of Si and other metallic elements. The Si—C solution 15 is produced by heating the raw material into a melt and by dissolving carbon (C) in this melt. Other metallic elements are, for example, titanium (Ti), manganese (Mn), chromium (Cr), cobalt (Co), vanadium (V), and iron (Fe). Among these metallic elements, preferable metallic elements are Ti, Cr, and Fe. Further preferable metallic elements are Ti and Cr.

Preferably, the crucible 14 contains carbon. In this case, the crucible 14 serves as a carbon supply source to the Si—C solution 15. For example, the crucible 14 may be a crucible formed of graphite or may be a crucible formed of SiC. An inner surface of the crucible 14 may be covered with SiC.

The heat insulating member 16 is formed of a heat insulator, and surrounds the crucible 14.

The heating device 18 is, for example, a high-frequency coil, and surrounds the side wall of the heat insulating member 16. In this case, the heating device 18 induction-heats the crucible 14. Thereby, the raw material held in the crucible 14 are melted, and the Si—C solution 15 is produced. The heating device 18 further keeps the Si—C solution 15 at a crystal growth temperature. The crystal growth temperature depends on the composition of the Si—C solution 15. The general crystal growth temperature is, for example, 1600 to 2000° C.

The rotating device 20 includes a rotating shaft 24 and a driving source 26.

The rotating shaft 24 extends in the height direction of the chamber 12 (the up-and-down direction of FIG. 1). The upper end of the rotating shaft 24 is positioned in the heat insulating member 16. At the upper end of the rotating shaft 24, the crucible 14 is disposed. The lower end of the rotating shaft 24 is positioned on the outside of the chamber 12.

The driving source 26 is arranged under the chamber 12. The driving source 26 is connected to the rotating shaft 24. The driving source 26 rotates the rotating shaft 24 around the center axis line thereof. Thereby, the crucible 14 (the Si—C solution 15) is rotated.

The elevating device 22 includes a seed shaft 28 and a driving source 30.

The seed shaft 28 is, for example, formed mainly of graphite. The upper end of the seed shaft 28 is positioned on the outside of the chamber 12. To a lower end surface 28S of the seed shaft 28, an SiC seed crystal 32 is to be attached.

The SiC seed crystal 32 is of a plate shape, and the upper surface thereof is attached to the lower end surface 28S. In this embodiment, as viewed in the axial direction of the seed shaft 28, the whole of upper surface of the SiC seed crystal 32 laps on the lower end surface 28S. The lower surface of the SiC seed crystal 32 serves as a crystal growth surface 32S.

The SiC seed crystal 32 consists of an SiC single crystal. Preferably, the crystal structure of the SiC seed crystal 32 is the same as the crystal structure of the SiC single crystal to be produced. For example, in the case where an SiC single crystal of 4H polymorph is to be produced, it is preferable that the SiC seed crystal 32 of 4H polymorph is used. In the case where the SiC seed crystal 32 of 4H polymorph is used, the crystal growth surface 32S is preferably the (0001) plane or a plane inclining at an angle of 8° or smaller from the (0001) plane. In this case, the SiC single crystal grows stably. Hereinafter, the SiC seed crystal is sometimes simply referred to as the "seed crystal".

The driving source 30 is positioned above the chamber 12. The driving source 30 is connected to the seed shaft 28.

The driving source 30 moves the seed shaft 28 up and down. Thereby, the crystal growth surface 32S of the seed crystal 32 attached to the lower end surface 28S of the seed shaft 28 can be brought into contact with the liquid surface of the Si—C solution 15 held by the crucible 14.

The driving source 30 rotates the seed shaft 28 around the center axis line thereof. Thereby, the seed crystal 32 attached to the lower end surface 28S of the seed shaft 28 is rotated. The direction of rotation of the seed shaft 28 may be the same as the direction of rotation of the crucible 14, or may be opposite thereto.

[Seed Shaft]

Figure 2:
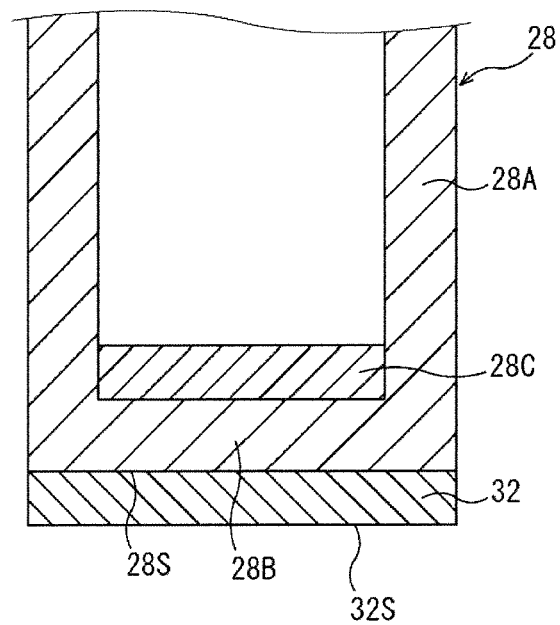
FIG. 2 is a sectional view of a seed shaft shown in FIG. 1.

Referring to FIG. 2, the seed shaft 28 is explained. The seed shaft 28 includes a cylinder part 28A, a bottom part 28B, and a low heat conductive member 28C. That is, the seed shaft 28 has a hollow-shell structure.

The bottom part 28B is located at the lower end of the cylinder part 28A, and closes the lower end of the cylinder part 28A. The lower surface of the bottom part 28B is the lower end surface 28S of the seed shaft 28.

In the example shown in FIG. 2, the bottom part 28B is formed integrally with the cylinder part 28A. However, the bottom part 28B need not be formed integrally with the cylinder part 28A. For example, the bottom part 28B may be screw-mounted to the lower end of the cylinder part 28A. The cylinder part 28A and the bottom part 28B are, for example, formed of graphite.

The low heat conductive member 28C is arranged on the upper surface of the bottom part 28B. In the example shown in FIG. 2, the low heat conductive member 28C covers the whole of upper surface of the bottom part 28B.

The low heat conductive member 28C has a thermal conductivity lower than that of the bottom part 28B. For example, in the case where the bottom part 28B is formed of graphite, the low heat conductive member 28C has a thermal conductivity lower than that of graphite. Preferably, the thermal conductivity of the low heat conductive member 28C is one tenth or less of the thermal conductivity of the bottom part 28B. When an SiC single crystal is produced, the temperature of the bottom part 28B and the low heat conductive member 28C would be, for example, 1000 to 2000° C. At such temperature, the thermal conductivity of the bottom part 28B is, for example, 60 to 35 W/(m·K), and the thermal conductivity of the low heat conductive member 28C is, for example, 0.3 to 0.6 W/(m·K).

The low heat conductive member 28C is preferably formed of a heat insulator. In the case where the bottom part 28B is formed of graphite (isotropic graphite), the heat insulator is, for example, alumina, zirconia, pyrolytic carbon, graphite sheet (anisotropic graphite in which the thermal conductivity in the axial direction of the seed shaft is lower than the thermal conductivity in the direction perpendicular to the axial direction), or carbon fiber. The thickness of the low heat conductive member 28C is set as appropriate according to the required heat dissipation amount.

[Method for Producing SiC Single Crystal]

The method for producing an SiC single crystal, which uses the production apparatus 10, is explained. First, the production apparatus 10 is prepared (preparing step). Next, the seed crystal 32 is attached to the seed shaft 28 (attaching step). Next, the crucible 14 is disposed in the chamber 12, and the Si—C solution 15 is produced (producing step). Next, the seed crystal 32 is brought into contact with the Si—C solution 15 in the crucible 14 (contacting step). Next, an SiC single crystal is formed and grown (growing step). Hereunder, the details of each step are explained.

[Preparing Step]

First, the production apparatus 10 is prepared.

[Attaching Step]

Successively, the seed crystal 32 is attached to the lower end surface 28S of the seed shaft 28. In this embodiment, the whole of upper surface of the seed crystal 32 is in contact with the lower end surface 28S of the seed shaft 28.

[Producing Step]

Next, the crucible 14 is disposed onto the rotating shaft 24 in the chamber 12. The crucible 14 holds the raw material for the Si—C solution 15.

Next, the Si—C solution 15 is produced. First, the atmosphere in the chamber 12 is replaced with an inert gas. Then, the raw material for the Si—C solution 15 in the crucible 14 is heated to the melting point or more. In the case where the crucible 14 is formed of graphite, when the crucible 14 is heated, carbon dissolves in the melt from the crucible 14, and the Si—C solution 15 is produced. The carbon of the crucible 14 dissolves in the Si—C solution 15 so that the carbon concentration in the Si—C solution 15 approaches the saturated concentration.

[Contacting Step]

Next, the seed crystal 32 is brought into contact with the Si—C solution 15. Specifically, the seed shaft 28 is lowered by the driving source 30, and thereby the seed crystal 32 is brought into contact with the Si—C solution 15.

[Growing Step]

After the seed crystal 32 has been brought into contact with the Si—C solution 15, the Si—C solution 15 is held at the above-described crystal growth temperature by the heating device 18. Further, the vicinity of the seed crystal 32 in the Si—C solution 15 is supercooled, and the SiC is made in a supersaturated state.

The method for supercooling the vicinity of the seed crystal 32 in the Si—C solution 15 is not restricted especially. For example, the temperature of the nearby region of the seed crystal 32 in the Si—C solution 15 may be made lower than the temperature of other regions by controlling the heating device 18.

While the nearby region of the seed crystal 32 in the Si—C solution 15 is in a SiC supersaturated state, the seed crystal 32 and the Si—C solution 15 (the crucible 14) are rotated. By rotating the seed shaft 28, the seed crystal 32 is rotated. By rotating the rotating shaft 24, the crucible 14 is rotated. The direction of rotation of the seed crystal 32 may be reverse to or the same as the direction of rotation of the crucible 14. Also, the rotating speed may be constant or changed. The seed shaft 28 is raised gradually while being rotated by the driving source 30. At this time, an SiC single crystal is formed on the crystal growth surface 32S of the seed crystal 32, which is in contact with the Si—C solution 15, and grows. The seed shaft 28 may be rotated without being raised. Further, the seed shaft 28 may neither be raised nor be rotated.

The seed shaft 28 has a hollow-shell structure. For the seed shaft 28 configured as such, the bottom part 28B is cooled mainly by upward radiation heat dissipation. In the radiation heat dissipation, the heat dissipation efficiency is the highest in the center of the bottom part 28B. This is because, in the center of the bottom part 28B, the solid angle to a low-temperature part (a metallic member for holding the seed shaft 28 on the upside) is large as compared with other regions of the bottom part 28B. The heat dissipation amount is larger with the decrease in distance from the low-temperature part to the bottom part 28B. Also, the outer surface of the seed shaft 28 is heated by the radiation from the inner surface of the crucible 14. Therefore, in the space in the seed shaft 28, the temperature is higher in a region closer to the cylinder part 28A. That is, in the space in the seed shaft 28, the temperature is lower at a position closer to the center axis. Therefore, the heat dissipation amount in the bottom part 28B is larger at a position more distant from the cylinder part 28A, that is, at a position closer to the center axis of the cylinder part 28A. As the result, a difference in temperature is liable to occur in the bottom part 28B. Therefore, the temperature distribution within the crystal growth surface 32S of the seed crystal 32 attached to the lower surface of the bottom part 28B (the lower end surface 28S of the seed shaft 28) is liable to be nonuniform.

In this embodiment, the low heat conductive member 28C is arranged so as to cover the whole of upper surface of the bottom part 28B. Therefore, by the low heat conductive member 28C, the heat dissipation of the bottom part 28B is suppressed. As the result, a difference in temperature is less liable to occur in the bottom part 28B. When difference in temperature is less liable to occur in the bottom part 28B, a difference in temperature is less liable to occur within the crystal growth surface 32S of the seed crystal 32 attached to the lower surface of the bottom part 28B (the lower end surface 28S of the seed shaft 28). As the result, unevenness is less liable to be produced on the growth surface of the SiC single crystal growing on the crystal growth surface 32S of the seed crystal 32. Also, assuming that the low heat conductive member 28C is arranged between the bottom part 28B and the seed crystal 32, at the time of crystal growth, the low heat conductive member 28C comes into contact with the Si—C solution 15, and a polycrystal of SiC grows from the low heat conductive member 28C. In this embodiment, the low heat conductive member 28C does not come into contact with the Si—C solution 15 because of being arranged in a space surrounded by the cylinder part 28A and the bottom part 28B. Therefore, in this embodiment, the polycrystal is less liable to be produced. Also, since the low heat conductive member 28C does not come into contact with the Si—C solution 15, the low heat conductive member 28C is less likely to wear, and also the Si—C solution 15 is not contaminated by the low heat conductive member 28C.

[Application Example 1]

The low heat conductive member need not cover the whole of upper surface of the bottom part 28B unlike the configuration shown in FIG. 2. The low heat conductive member has only to cover a region in which heat dissipation is to be suppressed in the bottom part 28B. For example, if it is desired to suppress the heat dissipation from the central portion of the bottom part 28B since the heat dissipation amount in the central portion of the bottom part 28B is large, as in a seed shaft 281 shown in FIG. 3, only the central portion of upper surface of the bottom part 28B may be covered by using a low heat conductive member 28C1. In this case, the difference in temperature between the central portion and the peripheral edge portion of the bottom part 28B can be made small.

[Application Example 2]

The low heat conductive member need not have a substantially constant thickness unlike the configuration shown in FIG. 2. The low heat conductive member may have a thicker portion covering a region in which it is desired to suppress the heat dissipation from the bottom part 28B. For example, if it is desired to suppress the heat dissipation from the central portion of the bottom part 28B since the heat dissipation amount in the central portion of the bottom part 28B is large, as in a seed shaft 282 shown in FIG. 4, a low heat conductive member 28C2 may include a first low heat conductive part 36A and a second low heat conductive part 36B. The first low heat conductive part 36A covers the whole of upper surface of the bottom part 28B. The second low heat conductive part 36B is smaller in size than the first low heat conductive part 36A in a plan view as viewed downward along the axis of the seed shaft 282, and is formed integrally with the first low heat conductive part 36A in the central portion of the upper surface of the first low heat conductive part 36A. In this case, the heat dissipation of the central portion of the bottom part 28B is suppressed more than that of the peripheral portion thereof.

[Application Example 3]

Figure 4:
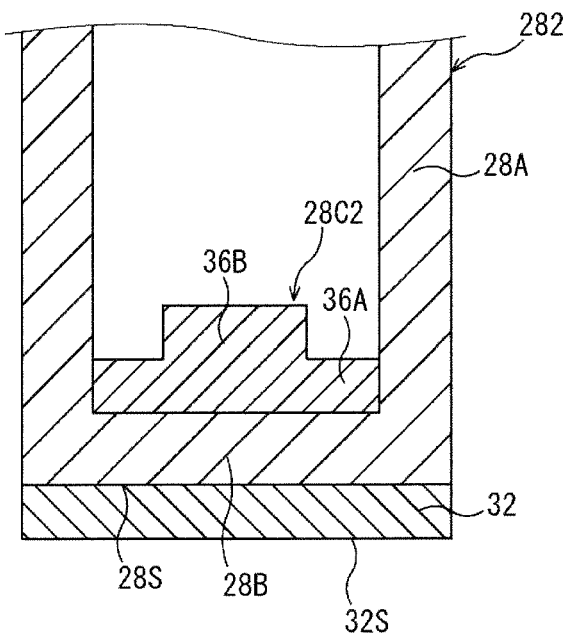
FIG. 4 is a sectional view showing an application example 2 of a seed shaft.

In the case where a part of the low heat conductive member is configured so as to be thicker than other parts thereof, the low heat conductive member need not configured so that the first low heat conductive part and the second low heat conductive part are formed integrally with each other unlike the configuration shown in FIG. 4. For example, as in a seed shaft 283 shown in FIG. 5, a low heat conductive member 28C3 may include a first low heat conductive part 38A and a second low heat conductive part 38B formed as a member separate from the first low heat conductive part 38A. The first low heat conductive part 38A covers the whole of upper surface of the bottom part 28B. The second low heat conductive part 38B is smaller in size than the first low heat conductive part 38A in a plan view as viewed downward along the axis of the seed shaft 283, and covers the central portion of upper surface of the first low heat conductive part 38A. Even in this case, the heat dissipation of the central portion of the bottom part 28B is suppressed more than that of the peripheral portion thereof.

Figure 5:
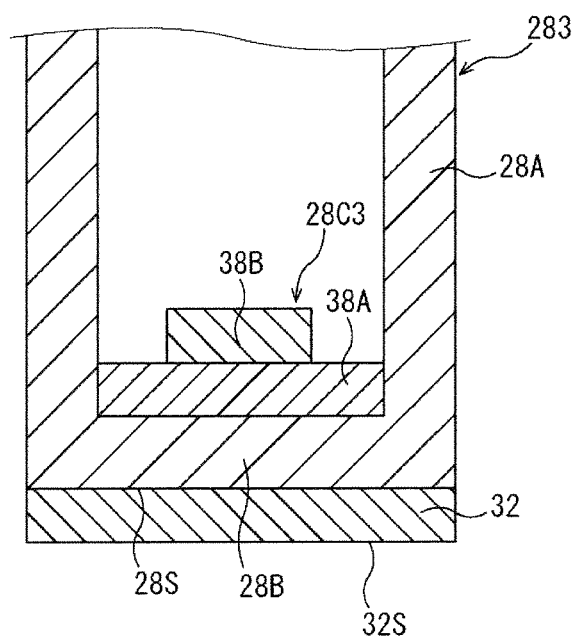
FIG. 5 is a sectional view showing an application example 3 of a seed shaft.
Figure 10:
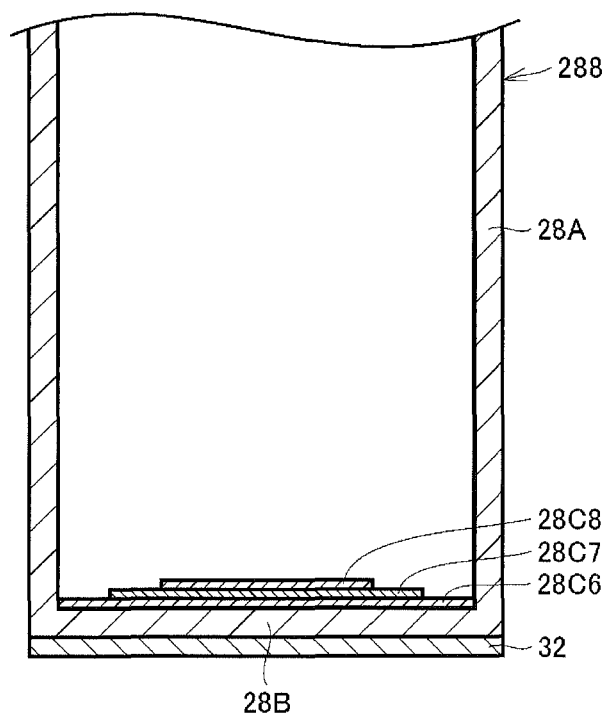
FIG. 10 is a sectional view showing a modification example of application example 3.
Figure 11:
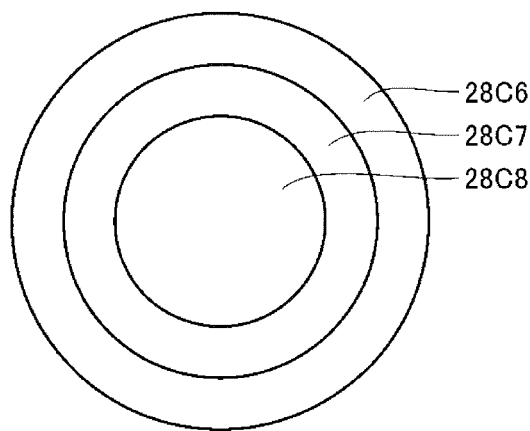
FIG. 11 is a plan view of a low heat conductive member shown in FIG. 10.

A seed shaft 288 shown in FIG. 10 is a modification example of the seed shaft 283 shown in FIG. 5, and includes a first low heat conductive member 28C6, a second low heat conductive member 28C7, and a third low heat conductive member 28C8. FIG. 11 is a plan view of the first to third low heat conductive members 28C6 to 28C8, as viewed downward along the axis of the seed shaft 288. Each of the first to third low heat conductive members 28C6 to 28C8 is of a disc shape, and these low heat conductive members 28C6 to 28C8 are arranged coaxially with respect to the axis of the seed shaft 288.

The first low heat conductive member 28C6 covers the whole of upper surface of the bottom part 28B. The second low heat conductive member 28C7 covers a region excluding the vicinity of the peripheral edge portion on the upper surface of the first low heat conductive member 28C6. The third low heat conductive member 28C8 covers a region excluding the vicinity of the peripheral edge portion on the upper surface of the second low heat conductive member 28C7. The low heat conductive member arranged on a higher layer has a smaller diameter. By configuring the low heat conductive member as such, the variations in temperature of the bottom part of the seed shaft can be reduced even in the case where the seed shaft diameter is large.

In the example shown in FIGS. 10 and 11, three low heat conductive members are used; however, four or more low heat conductive members, which are arranged coaxially and are configured such that the low heat conductive member arranged on a higher layer has a smaller diameter, may be used. By increasing the number of low heat conductive members in such a configuration, the variations in temperature of the bottom part of the seed shaft can be reduced further.

Figure 12:
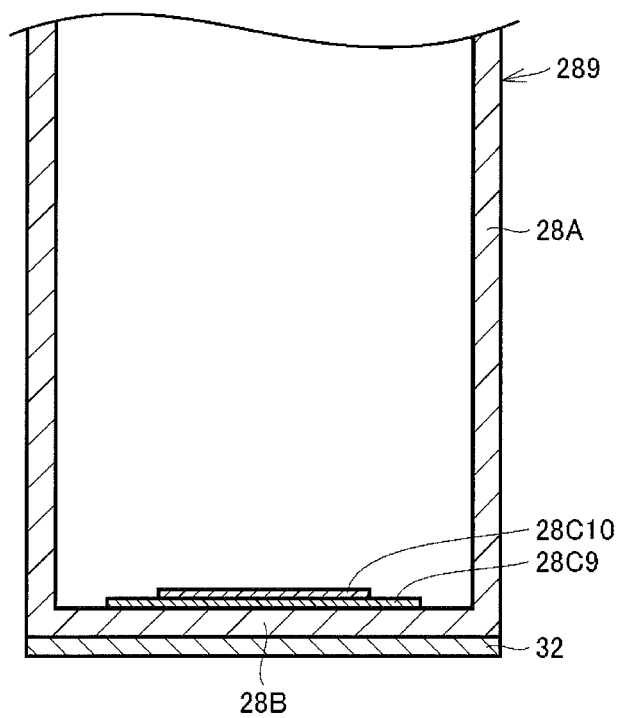
FIG. 12 is a sectional view showing another modification example of application example 3.
Figure 13:
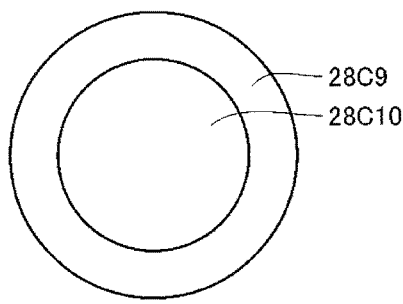
FIG. 13 is a plan view of a low heat conductive member shown in FIG. 12.

A seed shaft 289 shown in FIG. 12 is another modification example of the seed shaft 283 shown in FIG. 5. The seed shaft 289 includes a first low heat conductive member 28C9 and a second low heat conductive member 28C10. FIG. 13 is a plan view of the first and second low heat conductive members 28C9 and 28C10, as viewed downward along the axis of the seed shaft 289. Like the first to third low heat conductive members 28C6 to 28C8 shown in FIGS. 10 and 11, each of the first and second low heat conductive members 28C9 and 28C10 is of a disc shape, and these low heat conductive members 28C9 and 28C10 are arranged coaxially with respect to the axis of the seed shaft 289. The low heat conductive member arranged on a higher layer has a smaller diameter.

The first low heat conductive member 28C9 covers a region excluding the vicinity of the peripheral edge portion on the upper surface of the bottom part 28B. The second low heat conductive member 28C10 covers a region excluding the vicinity of the peripheral edge portion on the upper surface of the first low heat conductive member 28C9. Thus, the whole of upper surface of the bottom part 28B need not be covered by the low heat conductive member of the lowermost layer. Even by such a configuration, the variations in temperature of the bottom part of the seed shaft can be reduced even in the case where the seed shaft diameter is large.

[Application Example 4]

Figure 6:
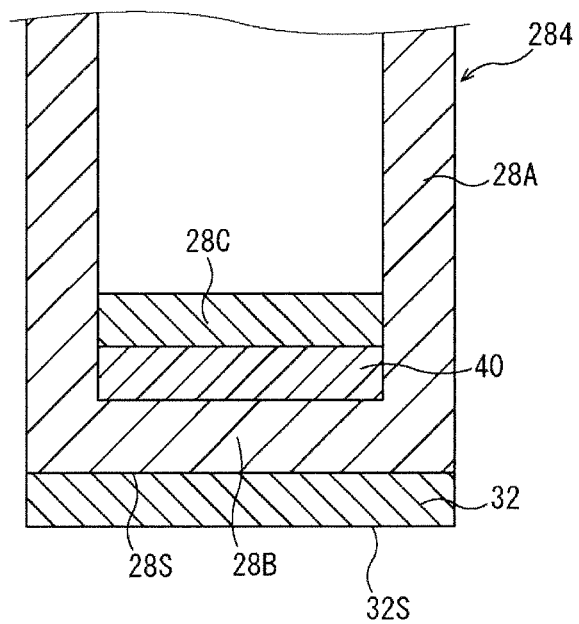
FIG. 6 is a sectional view showing an application example 4 of a seed shaft.

The low heat conductive member need not be in contact with the upper surface of the bottom part 28B. For example, in a seed shaft 284 shown in FIG. 6, a high heat conductive member 40 is arranged between the low heat conductive member 28C and the bottom part 28B. The high heat conductive member 40 has a thermal conductivity higher than that of the bottom part 28B. The high heat conductive member 40 is formed of, for example, a metal. For example, in the case where the high heat conductive member 40 is formed of tungsten, the thermal conductivity of the high heat conductive member 40 (the thermal conductivity at the temperature of the high heat conductive member 40 at the time when an SiC single crystal is produced) is 112 to 94 W/(m·K). In the example shown in FIG. 6, the high heat conductive member 40 is in contact with the whole of upper surface of the bottom part 28B, and the low heat conductive member 28C is in contact with the whole of upper surface of the high heat conductive member 40.

In this application example, the high heat conductive member 40 is in contact with the whole of upper surface of the bottom part 28B. The high heat conductive member 40 transmits heat more easily than the bottom part 28B. Therefore, in the bottom part 28B with which the high heat conductive member 40 is in contact, the temperature is less liable to vary.

In addition, since the low heat conductive member 28C covers the high heat conductive member 40, heat dissipation from the high heat conductive member 40 and the bottom part 28B is suppressed. As the result, the variations in temperature of the bottom part 28B can be restrained.

[Application Example 5]

Figure 7:
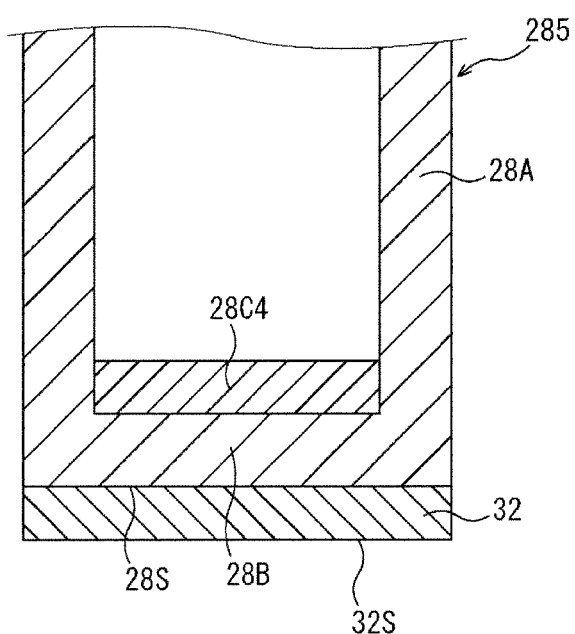
FIG. 7 is a sectional view showing an application example 5 of a seed shaft.

The thermal conductivity of the low heat conductive member may have an anisotropy. For example, in a seed shaft 285 shown in FIG. 7, the thermal conductivity in the axial direction of the seed shaft 285 of a low heat conductive member 28C4 is lower than the thermal conductivity in the direction perpendicular to the axial direction of the seed shaft 285. The low heat conductive member 28C4 is formed of, for example, pyrolytic graphite.

In this application example, the low heat conductive member 28C4 covers the whole of upper surface of the bottom part 28B. In the low heat conductive member 28C4, heat transfers more easily in the direction perpendicular to the axial direction of the seed shaft 285 than in the axial direction of the seed shaft 285. Therefore, in the bottom part 28B with which the low heat conductive member 28C4 is in contact, the temperature is less liable to be vary.

[Application Example 6]

Figure 8:
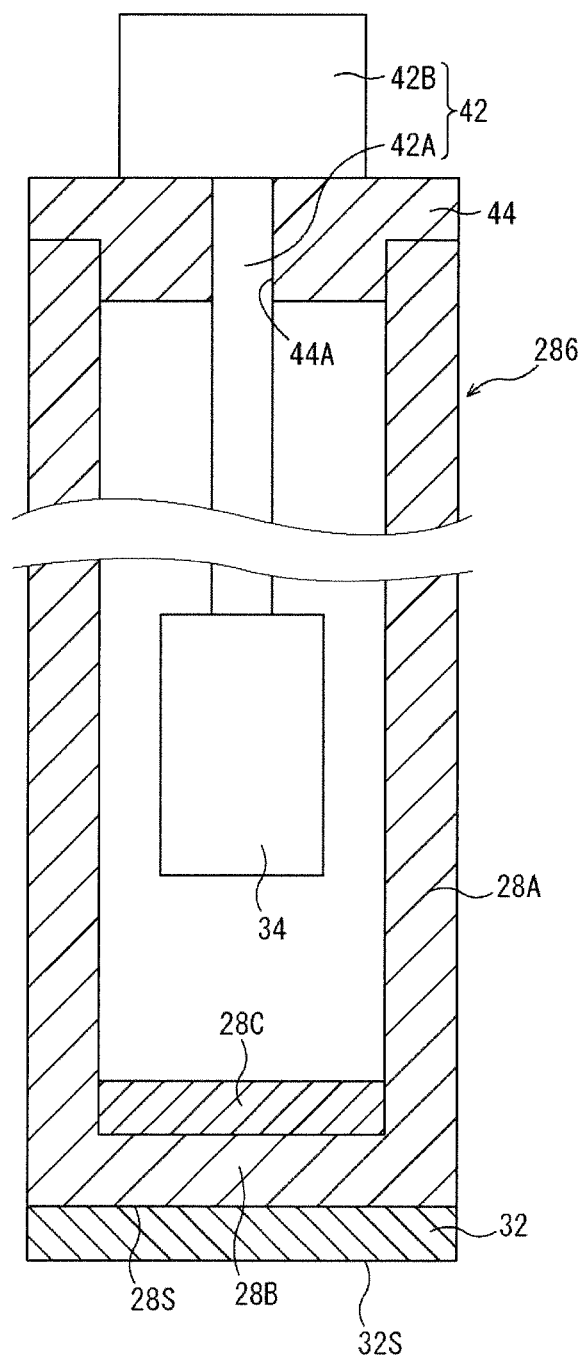
FIG. 8 is a sectional view showing an application example 6 of a seed shaft.

In a seed shaft 286 shown in FIG. 8, a heat absorbing source 34 is arranged in the cylinder part 28A. The heat absorbing source 34 is arranged above the low heat conductive member 28C. The heat absorbing source 34 is formed of, for example, a metallic tube. On the inside of the metallic tube, for example, a cooling tube in which cooling water flows is arranged. By the heat absorbing source 34, the radiation heat dissipation of the bottom part 28B is accelerated.

In the example shown in FIG. 8, the heat absorbing source 34 is arranged so as to be capable of going up and down. The heat absorbing source 34 is raised or lowered by an elevating device 42. The elevating device 42 includes a driving shaft 42A and a driving source 42B. The driving shaft 42A is connected to the heat absorbing source 34. The driving source 42B raises and lowers the driving shaft 42A. Thereby, the heat absorbing source 34 is raised and lowered. The driving source 42B is, for example, a motor. For example, the driving source 42B is arranged on the upper surface of a lid 44 covering the upper end opening of the seed shaft 286. In this case, the driving shaft 42A is inserted through a hole 44A formed in the lid 44.

In this application example, by the elevating device 42, the distance of the heat absorbing source 34 from the bottom part 28B can be regulated. Therefore, the heat dissipation amount in the bottom part 28B can be controlled.

[Application Example 7]

Figure 9:
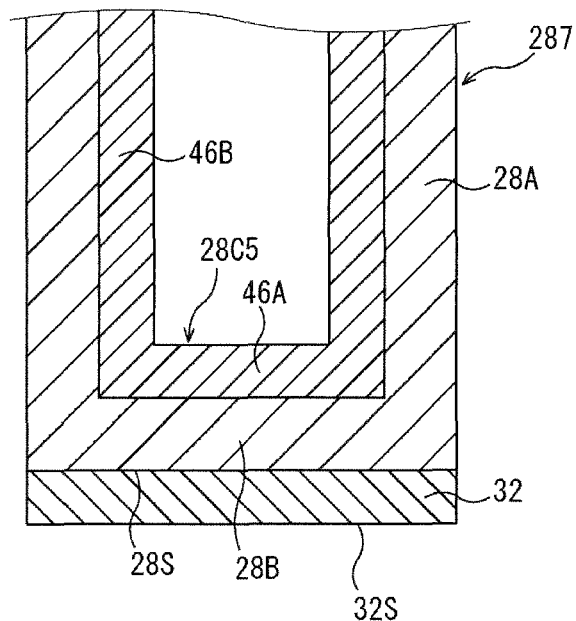
FIG. 9 is a sectional view showing an application example 7 of a seed shaft.

In a seed shaft 287 shown in FIG. 9, a low heat conductive member 28C5 includes a first covering part 46A and a second covering part 46B. The first covering part 46A covers the upper surface of the bottom part 28B. The second covering part 46B is connected to the upper surface peripheral edge portion of the first covering part 46A, and covers an inner peripheral surface of the cylinder part 28A.

In this case, by the cylinder part 28A, a rise in temperature in the seed shaft 287 can be avoided. Therefore, the unevenness of temperature in the seed shaft 287 is reduced.

EXAMPLES

The degree of change in temperature of the Si—C solution just under the SiC seed crystal in the case where the thickness of the low heat conductive member was different was examined by simulation. Also, for comparison, the degree of change in temperature of the Si—C solution just under the SiC seed crystal in the case where the diameter of a solid-core seed shaft was different was examined by simulation.

In this simulation, using an axisymmetric RZ system, a heat transfer and fluid flow analysis was calculated by the differential method. In this simulation, there were assumed the case where the seed shaft shown in FIG. 2 was used in the production apparatus shown in FIG. 1 and the case where a solid-core seed shaft was used in the production apparatus shown in FIG. 1. The region surrounded by the heat insulating member was made a subject to be calculated, and the temperature boundary condition of the heat insulating member surface was made radiation heat dissipation.

The heating device provided in the production apparatus was made a high-frequency coil. First, the electric current applied to the high-frequency coil was made 360 A of 6 kHz, and by an electromagnetic field analysis, the Joule heat in the crucible was calculated. Next, by using the calculated Joule heat distribution, a heat transfer and fluid flow analysis in the crucible was conducted. In the heat transfer and fluid flow analysis, the crucible and the seed shaft were made of the same carbon material quality. The diameter of the seed shaft was made equal to that of the seed crystal. For the seed shaft shown in FIG. 2, the thickness of the cylinder part was made 3 mm, and the thickness of the bottom part was made 3 mm. The lower end of the rotating shaft for supporting the crucible and the upper end of the seed shaft were configured so as to be cooled (water-cooled) to 25° C. by a cooling device. Also, the calculation was performed by using the physical properties of He for the inert gas introduced into the chamber 12 and by using the physical properties of an Si melt for the Si—C solution. In this heat transfer and fluid flow analysis, the steady calculation was performed.

Figure 14:
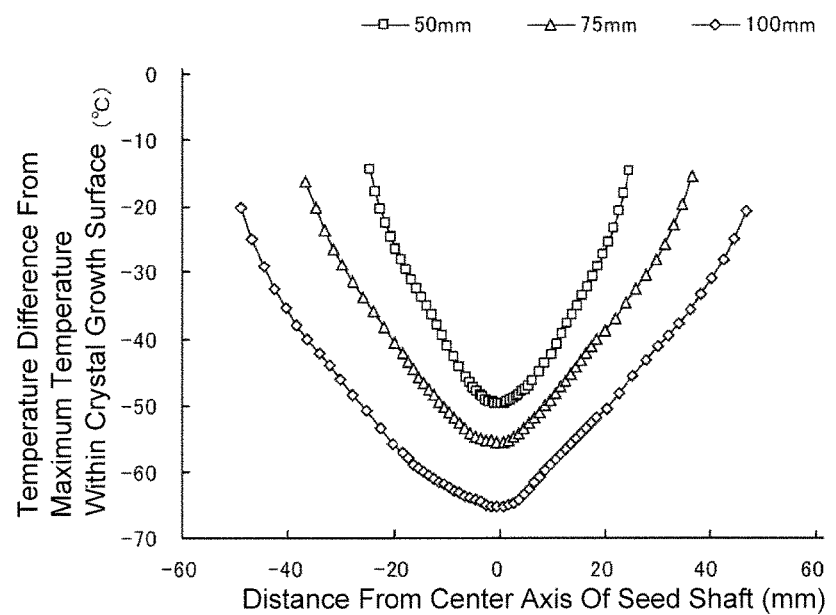
FIG. 14 is a graph showing a simulation result of temperature distribution of solution in the cases where the diameters of solid-core seed shafts are 50 mm, 75 mm, and 100 mm.

FIG. 14 shows the simulation result of Comparative Example, in which a solid-core seed shaft was used, that is, no low heat conductive member was provided. For the diameter of the seed shaft, three kinds of 50 mm, 75 mm, and 100 mm were used. It could be found that the solution temperature just under the seed crystal decreases with the increase in diameter of the seed shaft. Also, it could be found that the difference between the solution temperature just under the central portion of the seed crystal and the solution temperature just under the peripheral edge portion of the seed crystal increases with the increase in diameter of the seed shaft.

Figure 15:
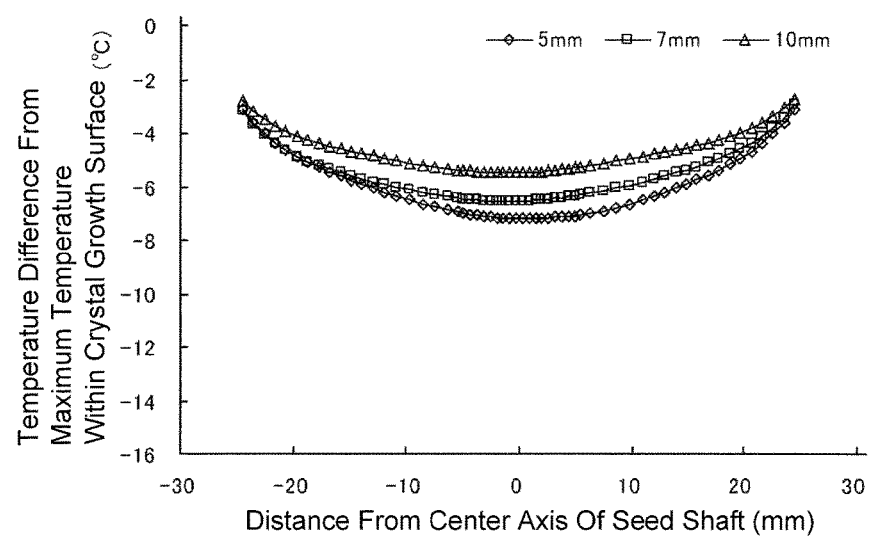
FIG. 15 is a graph showing a simulation result of temperature distribution of solution in the cases where the diameter of a hollow-shell seed shaft is 50 mm, and the thicknesses of low heat conductive members are 5 mm, 7 mm, and 10 mm.

FIG. 15 shows the simulation result of Inventive Example of the present invention, in which the diameter of the seed shaft (the outside diameter of the cylinder part) was 50 mm. For the thickness of the low heat conductive member, three kinds of 5 mm, 7 mm, and 10 mm were used. It could be found that by arranging the low heat conductive member on the upper surface of the bottom part of the hollow-shell seed shaft, the solution temperature just under the seed crystal is caused to be less liable to decrease than the case where the solid-core seed shaft was used (refer to FIG. 14). Also, it was found that by arranging the low heat conductive member on the upper surface of the bottom part of the hollow-shell seed shaft, the difference between the solution temperature just under the central portion of the seed crystal and the solution temperature just under the peripheral edge portion of the seed crystal is decreased as compared with the case where the solid-core seed shaft is used (refer to FIG. 14). Further, it was found that the temperature of the Si—C solution just under the seed crystal becomes less liable to decrease with the increase in thickness of the low heat conductive member.

Figure 16:
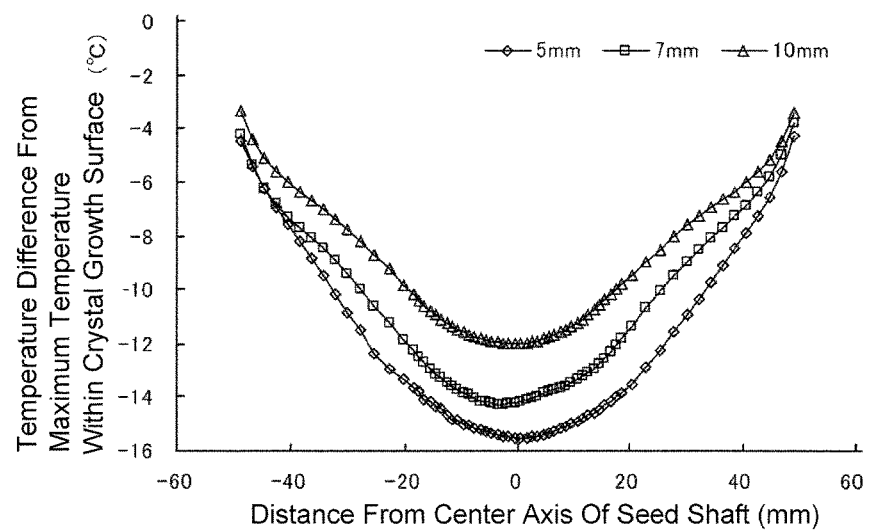
FIG. 16 is a graph showing a simulation result of temperature distribution of solution in the cases where the diameter of a hollow-shell seed shaft is 100 mm, and the thicknesses of low heat conductive members are 5 mm, 7 mm, and 10 mm.

FIG. 16 shows the simulation result of Inventive Example of the present invention, in which the diameter of the seed shaft (the outside diameter of the cylinder part) was 100 mm. For the thickness of the low heat conductive member, three kinds of 5 mm, 7 mm, and 10 mm were used. It could be found that by arranging the low heat conductive member on the upper surface of the bottom part of the hollow-shell seed shaft, the solution temperature just under the seed crystal is caused to be less liable to decrease than the case where the solid-core seed shaft was used (refer to FIG. 14). Also, it was found that by arranging the low heat conductive member on the upper surface of the bottom part of the hollow-shell seed shaft, the difference between the solution temperature just under the central portion of the seed crystal and the solution temperature just under the peripheral edge portion of the seed crystal is decreased as compared with the case where the solid-core seed shaft was used (refer to FIG. 14). Further, it was found that the temperature of the Si—C solution just under the seed crystal becomes less liable to decrease with the increase in thickness of the low heat conductive member.

Figure 17:
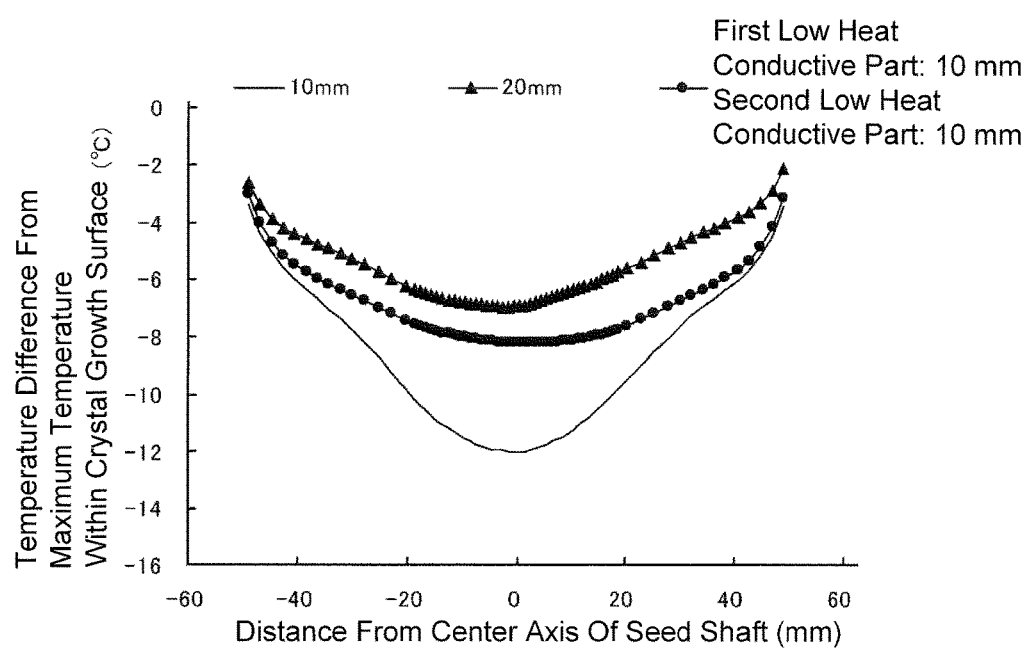
FIG. 17 is a graph showing a simulation result of temperature distribution of solution in the cases where the diameter of a hollow-shell seed shaft is 100 mm, and low heat conductive members are the low heat conductive member shown in FIG. 2 and the low heat conductive member shown in FIG. 5.

FIG. 17 shows the simulation result of Inventive Example of the present invention, in which the diameter of the seed shaft (the outside diameter of the cylinder part) was 100 mm. In this simulation, as the low heat conductive member, the low heat conductive member shown in FIG. 5 was assumed in addition to the low heat conductive member shown in FIG. 2. The thicknesses of the low heat conductive members shown in FIG. 2 were 10 mm and 20 mm. For the low heat conductive member shown in FIG. 5, the thickness of the first low heat conductive part was 10 mm, and the thickness of the second low heat conductive part was 10 mm. The diameter of the second low heat conductive part was equal to the radius of the first low heat conductive part. It could be found that by arranging the low heat conductive member on the upper surface of the bottom part of the hollow-shell seed shaft, the solution temperature just under the seed crystal is caused to be less liable to decrease than the case where the solid-core seed shaft was used (refer to FIG. 14). Also, by arranging the low heat conductive member on the upper surface of the bottom part of the hollow-shell seed shaft, the difference between the solution temperature just under the central portion of the seed crystal and the solution temperature just under the peripheral edge portion of the seed crystal is decreased as compared with the case where the solid-core seed shaft was used (refer to FIG. 14). Further, it was found that the temperature of the Si—C solution just under the seed crystal becomes less liable to decrease with the increase in thickness of the low heat conductive member. Still further, it was found that, for the low heat conductive member shown in FIG. 5, the temperature of the Si—C solution just under the central portion of the seed crystal becomes less liable to decrease.

All of Inventive Examples of the present invention shown in FIGS. 15 to 17 formed temperature profiles in which at a position closer to the center axis of the seed shaft, the temperature of the Si—C solution just under the seed crystal decreases. However, the apparatus may be configured so that there can be obtained a temperature profile in which, for example, at a position farther from the center axis of the seed shaft, the temperature of the Si—C solution just under the seed crystal decreases.

Figure 3:
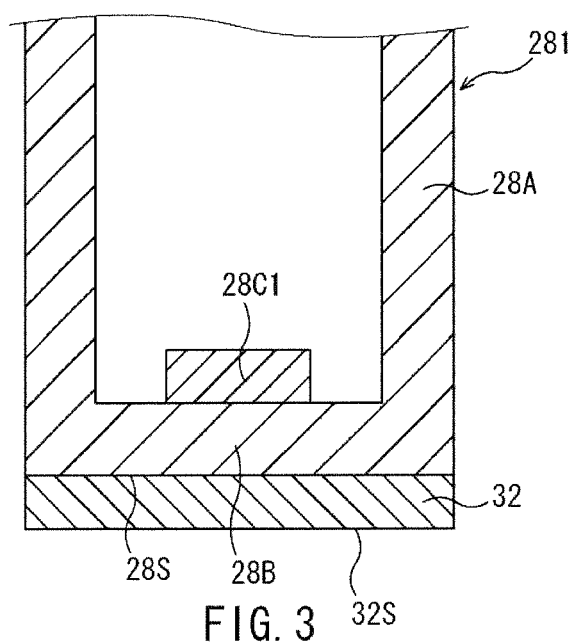
FIG. 3 is a sectional view showing an application example 1 of a seed shaft.

Also, for the low heat conductive member 28C5 shown in FIG. 9 (including the first covering part 46A and the second covering part 46B), like the low heat conductive member 28C2 or 28C3 shown in FIG. 3 or FIG. 4, in a plan view, the central portion of the first covering part 46A may be thicker than a portion surrounding the central portion (a portion that is not in contact with the second covering part 46B).

The above is a detailed description of the embodiments of the present invention. These application examples are merely illustrations, and the present invention is not limited by the above-described embodiments.

REFERENCE SIGNS LIST

10: production apparatus, 14: crucible, 15: Si—C solution, 28: seed shaft, 28S: lower end surface, 28A: cylinder part, 28B: bottom part, 28C: low heat conductive member, 32: SiC seed crystal, 34: heat absorbing source, 38A: first low heat conductive part, 38B: second low heat conductive part, 40: high heat conductive member, 42: elevating device

What is claimed is:

1. An apparatus for producing an SiC single crystal, which is used in a solution growth method, comprising:
    a seed shaft having a hollow structure and having a lower end surface to which an SiC seed crystal is to be attached; and
    a crucible for holding an Si—C solution, wherein
    the seed shaft comprises:
    a cylinder part;
    a bottom part which is located at a lower end of the cylinder part so as to close the lower end of the cylinder part and has the lower end surface; and
    a low heat conductive member which is arranged on an upper surface of the bottom part within the seed shaft and has a thermal conductivity lower than that of the bottom part.

2. The apparatus for producing an SiC single crystal according to claim 1, wherein the low heat conductive member is a heat insulator.

3. The apparatus for producing an SiC single crystal according to claim 1, wherein the low heat conductive member is arranged on a central portion of the bottom part.

4. The apparatus for producing an SiC single crystal according to claim 1, wherein a thickness of the low heat conductive member is larger in a central portion than in a peripheral edge portion thereof.

5. The apparatus for producing an SiC single crystal according to claim 4, wherein the low heat conductive member comprises:
    a first low heat conductive part arranged on the upper surface of the bottom part; and
    a second low heat conductive part arranged on the central portion of an upper surface of the first low heat conductive part.

6. The apparatus for producing an SiC single crystal according to claim 1, wherein the low heat conductive member comprises:
    a first covering part which covers the upper surface of the bottom part; and
    a second covering part which is connected to an upper surface of the first covering part and covers an inner peripheral surface of the cylinder part.

7. The apparatus for producing an SiC single crystal according to claim 1, wherein the seed shaft further comprises a high heat conductive member which is arranged between the low heat conductive member and the bottom part and has a thermal conductivity higher than that of the bottom part.

8. The apparatus for producing an SiC single crystal according to claim 7, wherein the high heat conductive member is a metal.

9. The apparatus for producing an SIC single crystal according to claim 1, wherein the thermal conductivity in the axial direction of the seed shaft of the low heat conductive member is lower than the thermal conductivity in the direction perpendicular to the axial direction of the seed shaft of the low heat conductive member.

10. The apparatus for producing an SiC single crystal according to claim 9, wherein the low heat conductive member is pyrolytic graphite.

11. The apparatus for producing an SiC single crystal according to claim 1, wherein the apparatus further comprises:
    a heat absorbing source arranged above the low heat conductive member in the cylinder part; and
    an elevating device for moving the heat absorbing source up and down.

12. A method for producing an SiC single crystal using a solution growth method, in which the apparatus according to claim 1 is used, comprising the steps of:
    attaching the SiC seed crystal to the lower end surface of the seed shaft;
    heating the crucible holding a raw material to produce the Si—C solution;
    bringing the SiC seed crystal attached to the lower end surface of the seed shaft into contact with the Si—C solution; and
    forming and growing an SiC single crystal on the SiC seed crystal.

13. A seed shaft, which is used to produce an SiC single crystal using a solution growth method, has a hollow structure and a lower end surface to which an SiC seed crystal is to be attached, the seed shaft further comprising:
    a cylinder part;
    a bottom part which is located at a lower end of the cylinder part so as to close the lower end of the cylinder part and has a lower end surface; and
    a low heat conductive member which is arranged on an upper surface of the bottom part within the seed shaft and has a thermal conductivity lower than that of the bottom part.

* * * * *